United States Patent [19]

Sharples

[11] Patent Number: 4,815,824
[45] Date of Patent: Mar. 28, 1989

[54] ELLIPTICAL LCD BAR GRAPH WITH PATH OUTLINE-DEFINING SEGMENTS

[76] Inventor: Kenneth R. Sharples, 102 Herbert St., Braintree, Mass. 02184

[21] Appl. No.: 159,169

[22] Filed: Feb. 23, 1988

[51] Int. Cl.$^4$ .............................................. G02F 1/13
[52] U.S. Cl. .................................... 350/336; 350/332; 340/753; 340/765; 340/784
[58] Field of Search ................ 350/332, 336; 340/753, 340/765, 784

[56] References Cited

U.S. PATENT DOCUMENTS

| | | | |
|---|---|---|---|
| 4,342,030 | 7/1982 | Shanks | 350/336 X |
| 4,392,717 | 7/1983 | Shibuya et al. | 350/336 X |
| 4,435,046 | 3/1984 | Nishimura | 350/336 X |
| 4,544,238 | 10/1985 | Nickol | 350/336 |
| 4,624,529 | 11/1986 | Dorfman | 350/336 X |
| 4,629,289 | 12/1986 | Streit | 350/336 |

Primary Examiner—Stanley D. Miller
Assistant Examiner—Richard Gallivan
Attorney, Agent, or Firm—Joseph S. Iandiorio; Michael L. Sheldon

[57] ABSTRACT

A liquid crystal analog display device that displays along a predetermined path defined by a path outline. It includes a backplane defining the path outline; a plurality of display segments disposed along the path; a display segment backplane; a plurality of outline segments associated with the display segments for further defining the path outline; means for applying an electric potential to the display and outline segments; means for applying an electric potential to the path outline backplane so that there is an a.c. field across the path outline segment and the path outline backplane sufficient to maintain the path outline image; and means for selectively applying an electric field across the display segments and the display segment backplane for establishing an analog image display. There is also disclosed means for applying an electric potential to the backplane defining picket outlines so that there is an a.c. field across the picket outline backplane and the associated display segment sufficient to maintain the picket outline image.

13 Claims, 6 Drawing Sheets

DISPLAY WAVEFORMS

ELLIPTICAL LCD BAR GRAPH WITH PATH OUTLINE-DEFINING SEGMENTS

FIELD OF INVENTION

This invention relates to a liquid crystal display device having a defined path outline and major pickets, and more particularly to such a device having an elliptical or otherwise bent path.

BACKGROUND OF INVENTION

Liquid crystal display devices are commonly used in calculators, watches, electronic thermometers, and the like. Generally information is presented numerically or in analog form such as a bar graph. Conventional numeric displays provide an accurate value, but reading the numeric display becomes difficult when displayed values move quickly between higher and lower values. For these situations an analog bar graph display device is easier to read.

LCD bar graphs are analog displays having a plurality discrete segments which represent quantitative increments, i.e, a scale on the graph. Increasing the number of segments increases the resolution of the bar graph, but at the expense of increasing the overall length of the bar graph. For example, a bar graph having 100 segments provides 1% step increments from 0 up to full scale. Scales with this resolution are generally 3½ to 4 inches long. Attempts to reduce the overall length of the high resolution bar graphs by reducing the width of each segment is generally limited by economical considerations for low cost displays and by the difficulty in visually resolving the small increments. While curving the path of the display or folding it back on itself condenses the display into a smaller area, it raises the problem of defining the path of the display so viewers will know what to expect. This is difficult because the drive circuits and lead patterns prevent a display of the path outline in close proximity to the bar graph display where it will do the most good. It is also valuale major pickets available to provide an easy understanding of the display position.

SUMMARY OF INVENTION

It is therefore an object of this invention to provide a condensed liquid crystal display device.

It is a further object of this invention to provide such a device which can condense both a high-resolution analog display and a numerical display into a small area.

It is a further object of this invention to provide such a device which shows the path of the display and the higher order scale.

It is a further object of this invention to provide a panel meter having a condensed analog display.

The invention results from the realization that a truly effective path outline and major pickets can be provided for a liquid crystal analog display in close proximity to the display segments without crossing leads so that unconventional paths as well as straight paths may be easily defined for the viewer.

This invention features a liquid crystal analog display device that displays along a predetermined path defined by a path outline. The device includes a backplane defining the path outline and a plurality of display segments disposed along the path. There is a display segment backplane and a plurality of outline segments associated with the display segment for further defining the path outline. There are means for applying an electric potential to the display and outline segments, and means for applying an electric potential to the path outline backplane so that there is an a.c. field across the path outline segment and the path outline backplane sufficient to maintain the path outline image. There are means for selectively applying an electric field across the display segments and the display segment backplane for establishing an analog image display.

In a preferred embodiment, the path may be elliptical and the outline segments may be disposed in close proximity to produce the illusion of a continuous outline. The path outline may include two boundaries, one on each side of the path. In addition, a digital display may accompany the analog display. The segments may be energized by leads extending outside of the path and may further include means for blocking electro-optic effects caused by the leads. The means for blocking may include an opaque material.

The invention also features a liquid crystal analog display device that displays along a predetermined path including a number of major pickets representing a delineation of higher order scale value. There is a backplane defining the picket outlines, a plurality of display segments disposed along the path, and a display segment backplane. There are means for applying an electric potential to the display segments and means for applying an electric potential to the backplane for defining the picket outline so there is an a.c. field across the picket outline backplane and the associated display segment sufficient to maintain the picket outline image. There are means for selectively applying an electric field across the display segments and a display segment backplane for establishing an analog image display.

In a preferred embodiment an associated display segment overlies the picket outline backplane and a portion of an adjacent spaced display segment backplane for establishing an a.c. electric field across that associated display segment and display segment backplane for creating the image of a segment at the picket when the analog display reaches a value of that picket. The display segment may overlie equal widths on each of the display segment backplane, and picket outline backplane. The space between the backplane may be equal in width to that of the overlay of the display segment on the backplanes.

BRIEF DESCRIPTION OF THE DRAWING FIGURES

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

This invention may be accomplished by a liquid crystal display (LCD) device having an analog display that establishes a bent path which maximizes the available display area of the device. The display is condensed into a smaller area than is possible with conventional devices.

Figure 1:
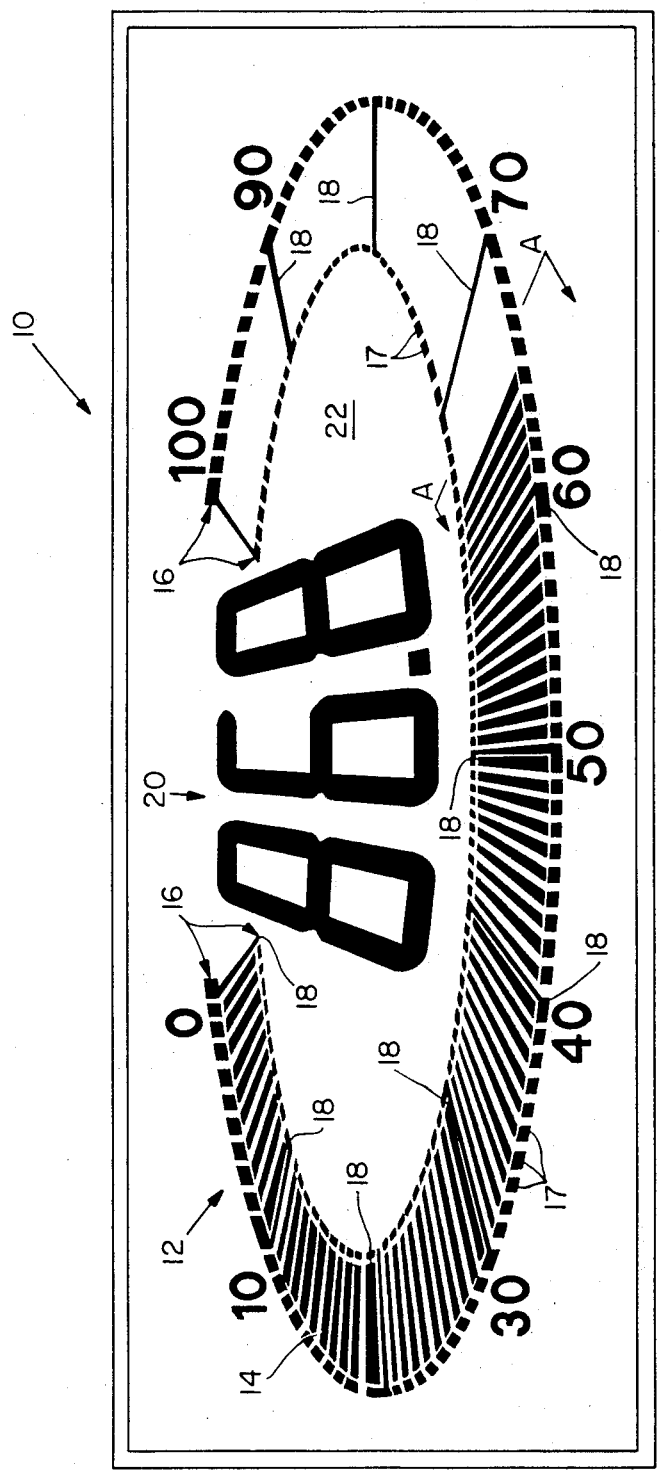
FIG. 1 is a schematic view of the display face of an elliptical LCD bar graph according to this invention.
Figure 6A:
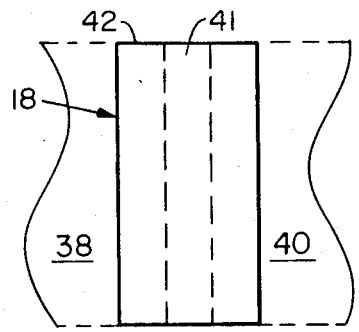
FIG. 6A is a view of a major picket of the elliptical LCD bar graph of FIG. 1.

A liquid crystal analog panel meter 10 according to this invention is shown in FIG. 1. Panel meter 10 has an elliptical bar graph 12 for electro-optically displaying a measured value. The elliptical shape of the bar graph 12 is preferred because it provides a simple, uniform shape which allows a plurality of bars or segments 14 to be compressed into a small display area. Bar graph 12 includes an outline 16 which indicates the path of the graph and major pickets 18 which are equally distributed along the bar graph for dividing the graph into a higher order scale. The displayed image of a segment at a major picket is formed of two segments spaced apart. Preferably the two segments and the space are all of equal width. This is not shown in proportion in FIG. 1, but is explained in more detail with respect to FIG. 6A. The outlines 16 are formed by path outline segments 17 associated with each segment 14 in conjunction with the outline backplane shown in more detail with respect to FIG. 2. The outline segments 17 are discrete and very closely spaced, typically 0.005, so that when energized the outlines 16 appear as solid lines. In the preferred embodiment, both outlines 16 and major pickets 18 are electro-optically displayed when meter 10 is energized. A numerical scale is placed around the outside perimeter of the graph 12 adjacent to major pickets 18 to indicate linear or nonlinear quantities such as temperature, percent, $CO_2$, rpm, ph, etc. The numbers of the higher order scale may be electro-optically displayed or deposited on the front of the display using an adhesive or other suitable means. In the preferred embodiment a numeric digital readout 20 is positioned within a partially enclosed area 22 for indicating a measured value that is different than the analog value shown on bar graph 12. Alternatively, the digital display may reflect the same proportionate value shown on bar graph 12.

Figure 2:
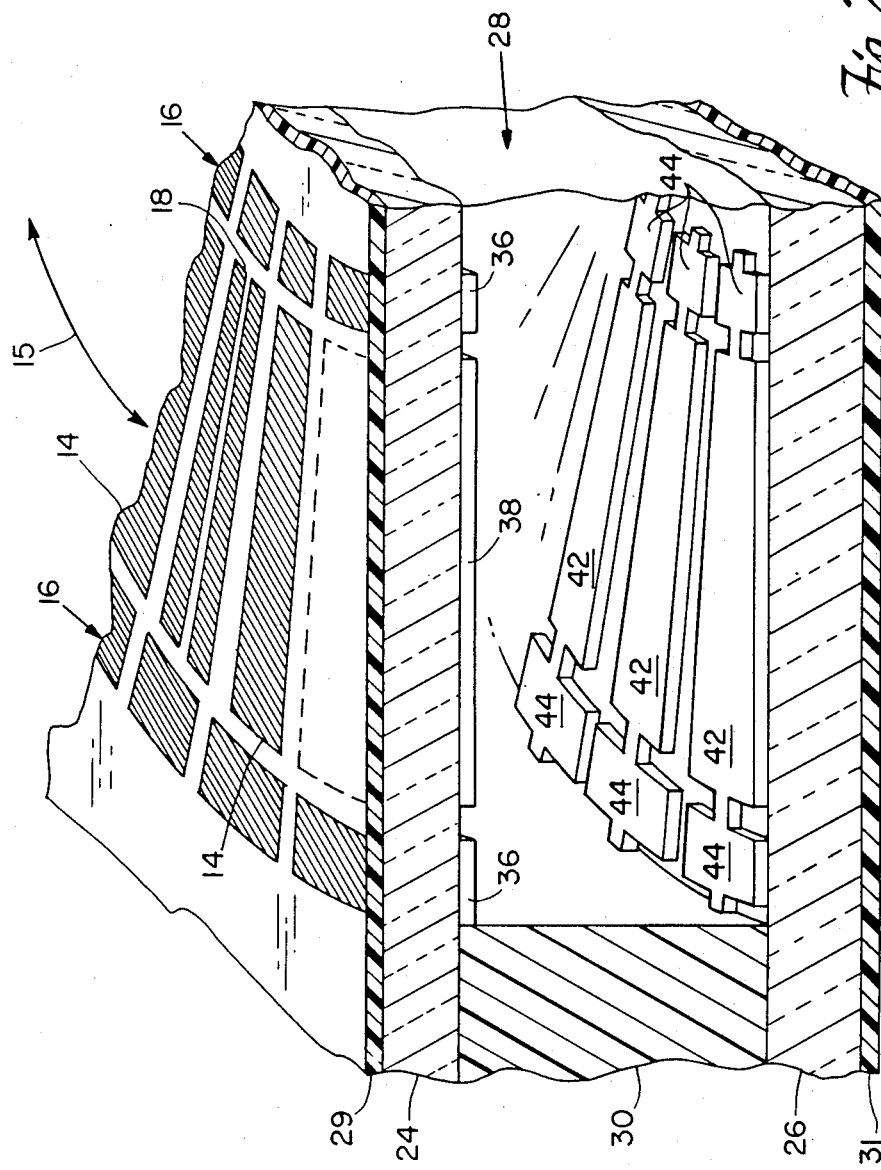
FIG. 2 is an axonometric sectional view of the elliptical LCD bar graph of FIG. 1 along line A—A illustrating its construction.

The construction of the analog panel meter 10 is illustrated in FIG. 2. Meter 10 consists of two plates of glass 24, 26 separated by a thin layer of liquid crystal 28 contained by seal 30. The inside surfaces of glass plates 24 and 26 are striated for aligning the molecules of the liquid crystal 28 to lie parallel to each plate's surface. In the preferred embodiment, the induced direction on one glass plate is rotated 90 degrees with respect to the other for creating a twisted nematic effect until an electric field is applied across the crystal. Polarizing films 29 and 31 are secured to the outside surfaces of the glass plates 24, 26 using conventional methods.

On the inside of each of the glass plates are transparent conductors for selectively applying an electric field across the liquid crystal layer. The transparent conductors, which may consist of tin oxide or indium oxide, are etched on the surfaces of each plate using conventional methods. When an electric field is applied, bars 14, outline 16 and major pickets 18 are images which appear behind front plate 24 and lie along a bent path as shown by arrow 15 as described below.

Figure 3:
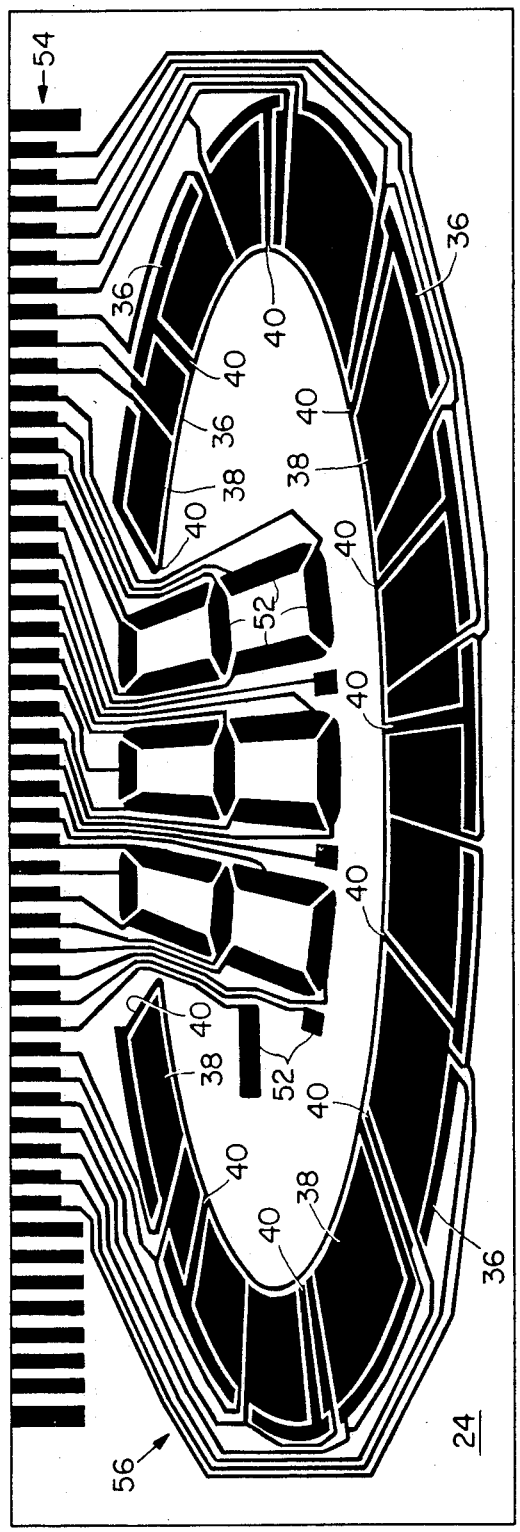
FIGS. 3-5 are schematic views of layers of the elliptical LCD bar graph of FIG. 1.

As also shown in FIG. 3, conductors on the front or top plate 24 include outline backplanes 36 for displaying the path outline of meter 10 and a plurality of discrete bar graph segment backplanes 38. Transparent conductors are as shown in black in FIGS. 3 and 5 for clarity. In this construction the interior portion of the outline is connected to the exterior portion by eleven major pickets 40 uniformly distributed between the discrete backplanes 38.

Figure 5:
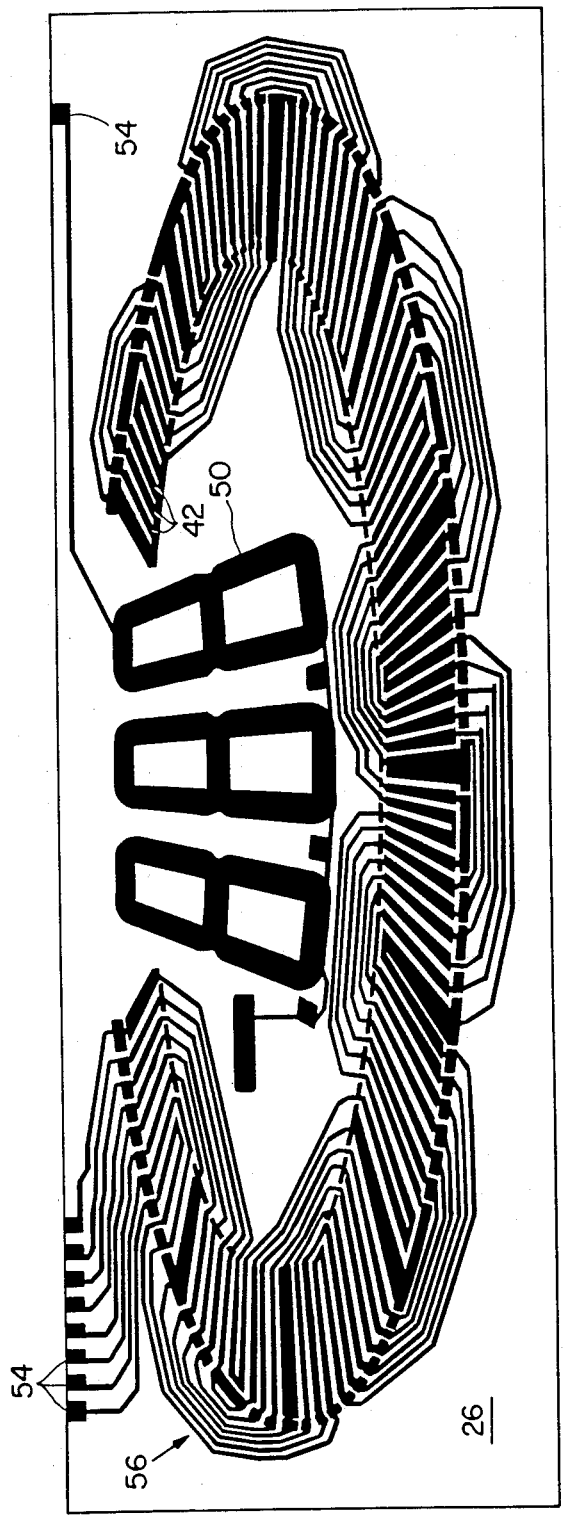

The rear or bottom conductors, FIG. 5, include one hundred one discrete display elements which are connected in groups of eight and which serpentine across the plurality of backplanes 38 formed on the front plate 24 and are arranged in a bent path. Associated with display elements 42 are a plurality of path outline segments 44 overlying outline backplane 36 on the front plate 24 and display segments 42 which are displayed as bars 14 when they are selectively energized. At each picket 18 there is a segment 42 overlying two backplanes 38 and 40, FIG. 6A, with a space 41 between them. Regardless of the state of segment 42 picket 18 is always on. The image which normally appears as picket 18 is created by segment 42 and backplane 40. When the displayed value actually causes segment 42 to be turned on, then the image which appears on picket 18 includes not only that produced by segment 42 and backplane 40 but also that produced by segment 42 and backplane 38 with a space 41 between them. Thus space 41 appears as the major picket overlying segment 42. The shift which accomplishes this involves such small dimensions that the eye is tricked into seeing a reversal of the major picket image when the segment 42 is on. A backplane 50 and a plurality of segments 52, FIGS. 3 and 5, are also provided on the plates 24, 26 for creating a digital display. Each of backplanes and segments are connected to pads 54 at the edges of plates 24, 26 by leads 56 as shown.

Figure 4:
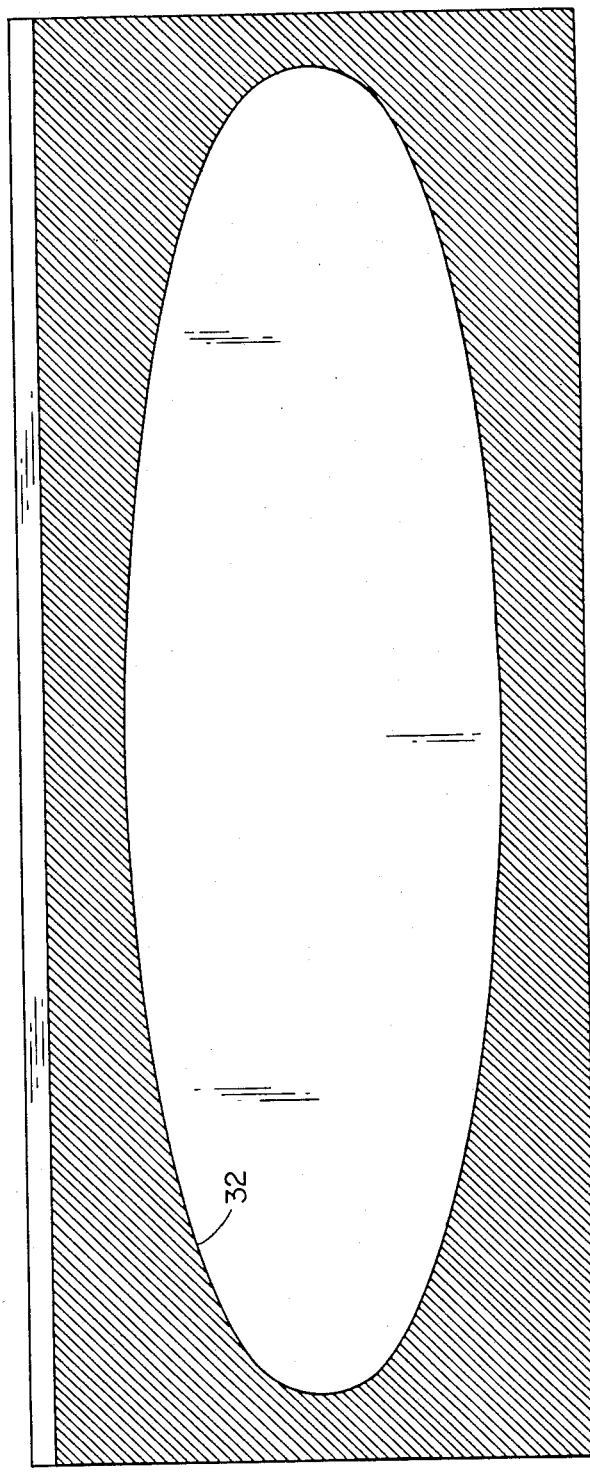

Referring to FIG. 4, an opaque material 32 such as black paint is silkscreened on top of glass plate 24 to match the area surrounding the exterior outline of bar graph 12 for blocking the field generated between leads 56 interconnecting display segments 42 and backplanes 38.

Bar graph 12 is constructed so that after the last display segment 46 the higher-value segments 46 remain off while preceding segments 46 remain on. This allows backplanes 38 on front plate 24 to be driven in one of three modes by multiplex drive unit 58. The three modes include an ON mode, an OFF mode, and an ACTIVE or UNIQUE mode. In the ON mode the potential applied between backplane 38 and its underlying display element 42 is always sufficient to electro-optically display each of its bars 14. In the OFF mode the reverse is true. The potential between backplane 38 and its underlying display segment 42 is minimized to keep its bars 14 from being displayed. In the ACTIVE mode, the signal applied to the backplane is such that the potential between the backplane and the display segment is dependent on the signal supplied to the display segment. In other words, a bar 14 appears when an ON waveform is supplied to a display segment, and no bar appears when an OFF waveform is applied to a display segment.

Major pickets 18 and outline 16 are continuously displayed when the meter 10 is energized by controlling the potential outline between backplane 36 and display segments 42. Outline backplane 36 is driven by waveform D, FIG. 7, and display elements 42 are driven by waveform D or C of FIG. 7. The combination of drive signals results in outline 16 and major pickets 18 being continuously displayed. Segments 52 and backplane 50 of the digital display 20 are independently driven by their own backplane and signal drives in a conventional manner.

Figure 6B:
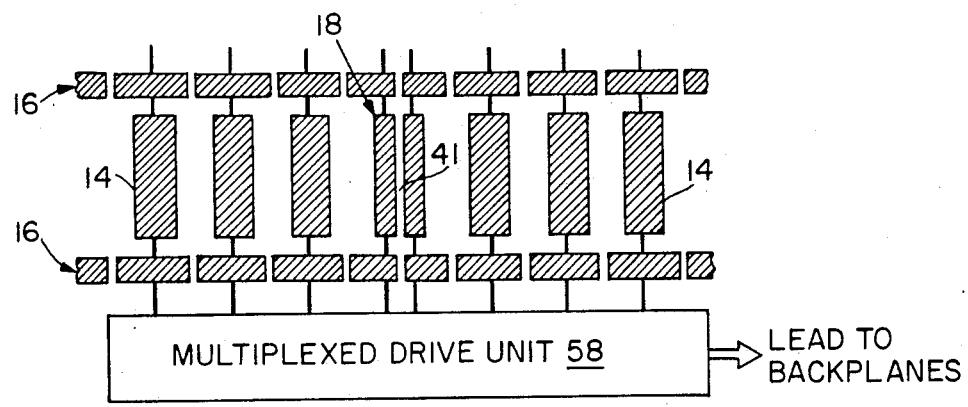
FIG. 6B is a view of a portion of the display segments of the elliptical LCD bar graph of FIG. 5.
Figure 7:
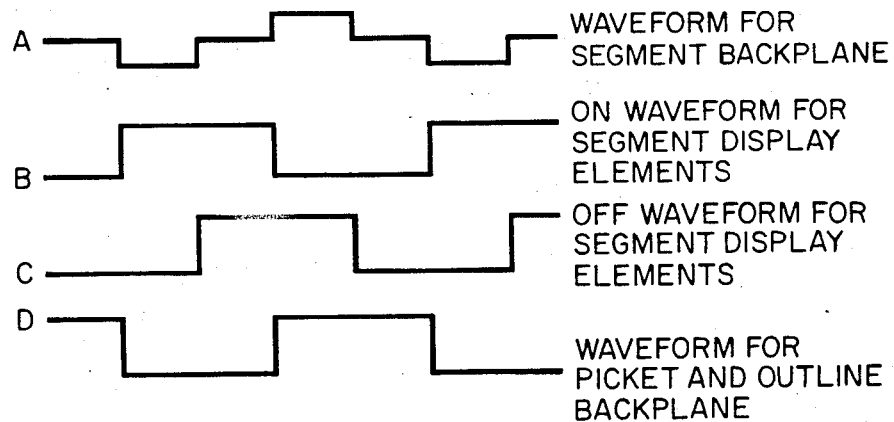
FIG. 7 is a timing diagram illustrating the waveforms applied to the elliptical LCD bar graph of FIG. 1.

In the preferred construction of the active mode, backplane 38 and display segments 42 of bar graph 12 are driven by waveforms shown in FIG. 7. Backplane 38 is driven with a three-level waveform while display segments 42 are selectively driven, by multiplexed drive unit 58, FIG. 6B, with either an ON waveform or an OFF waveform. This type of multiplexed drive scheme is known to those skilled in the art. For example, a similar drive scheme is described on the data sheet for component model No. ICL7182 available from Intersil.

Although a panel meter has been described above in terms of an elliptical bar graph, this is not a limitation of this invention. Other design arrangements of display elements and backplanes are possible. For example, the outline of the bar graph may consist of a series of dots. Further, the mode of displaying bars may be limited to only that bar which indicates the measured value. Still further, polarizers may be used to give a white on black display. Edge o back lighting may also be included to improve brightness and permit viewing in darkness. Also, the major pickets or the outline may be permanently deposited on the face of the display by using an adhesive or other suitable means.

Although specific features of the invention are shown in some drawings and not others, this is for convenience only as each feature may be combined with any or all of the other features in accordance with the invention.

Other embodiments will occur to those skilled in the art and are within the following claims:

I claim:

1. A liquid crystal analog display device that displays along a predetermined path defined by a path outline, comprising:
    a backplane defining the path outline;
    a plurality of display segments disposed along the path;
    a display segment backplane;
    a plurality of outline segments associated with the display segments for further defining the path outline;
    means for applying an electric potential to the display and outline segments;
    means for applying an electric potential to the path outline backplane so that there is an a.c. field across the path outline segments and the path outline backplane sufficient to maintain the path outline image; and
    means for selectively applying an electric field across said display segments and said display segment backplane for establishing an analog image display.

2. The device of claim 1 in which said path outline is elliptical.

3. The device of claim 1 in which said outline segments are disposed in close proximity to produce the illusion of a continuous outline.

4. The device of claim 3 in which said path outline includes two boundaries one on each side of the path.

5. The device of claim 1 further including a digital display accompanying the analog display.

6. The device of claim 1 in which said segments are energized by leads extending outside of the path and further including means for blocking electro-optic effects caused by the leads.

7. The liquid crystal display device of claim 6 in which means for blocking includes opaque material.

8. A liquid crystal analog display device that displays an analog image display along a predetermined path that includes a number of major pickets representing a delineation of a higher order scale value, comprising:
    a backplane defining the picket outlines;
    a plurality of display segments disposed along the path;
    a display segment backplane;
    means for applying an electric potential to said display segments;
    means for applying an electric potential to said backplane defining the picket outlines so that there is an a.c. field across the picket outline backplane and an associated display segment sufficient to maintain the picket outline image; and
    means for selectively applying an electric field across said display segments and said display segment backplane for establishing the analog image display.

9. The device of claim 8 in which the associated display segment overlies the picket outline backplane and a portion of an adjacent, spaced, display segment backplane for establishing an electric potential across that associated display segment and display segment backplane for creating the image of a segment at the picket when the analog display reaches the value of that picket.

10. The device of claim 9 in which the display segment overlies equal widths on each of the display segment backplane and picket outline backplane.

11. The device of claim 10 in which the space between the backplanes is equal in width to that of the overlay of the display segment and the backplanes.

12. The device of claim 8 in which said path is elliptical.

13. A liquid crystal analog display device that displays along a predetermined path defined by a path outline and including a number of major pickets, comprising:
    a backplane defining the path outline and picket outline;
    a plurality of display segments disposed along the path;
    a display segment backplane;
    a plurality of outline segments associated with the display segments for further defining the path outline;
    means for applying an electric potential to the display and outline segments;
    means for applying an electric potential to the path outline and picket outline backplane so that there is an a.c. field across the path outline and display segments and the path outline backplane sufficient to maintain the path outline and major picket images;
    means for selectively applying an electric field across said display segments and said display segment backplane for establishing an analog image display.

* * * * *